United States Patent [19]

Morii et al.

[11] Patent Number: 4,904,967
[45] Date of Patent: Feb. 27, 1990

[54] LC COMPOSITE COMPONENT

[75] Inventors: Hiroshi Morii; Yasuyuki Naito; Takeshi Azumi; Yukio Sakabe, all of Kyoto, Japan

[73] Assignee: Murata Manufacturing Co., Ltd., Japan

[21] Appl. No.: 303,449

[22] Filed: Jan. 27, 1989

[30] Foreign Application Priority Data

Jan. 27, 1988 [JP] Japan .................................. 63-16517

[51] Int. Cl.$^4$ ............................................. H03H 7/00
[52] U.S. Cl. ................................... 333/185; 333/167; 333/184; 361/321
[58] Field of Search ........................ 333/167, 181-185; 336/200, 232; 361/303, 302, 321

[56] References Cited

U.S. PATENT DOCUMENTS 4,746,557 5/1988 Sakamoto et al. .............. 333/184 X
4,801,904 1/1989 Sakamoto et al. .............. 333/185 X Primary Examiner—Eugene R. LaRoche
Assistant Examiner—Seung Ham
Attorney, Agent, or Firm—Ostrolenk, Faber, Gerb & Soffen

[57] ABSTRACT

An LC composite component comprises a laminated structure which is formed by stacking first and second inductor layers while holding a capacitor layer between the same. The first and second inductor layers comprise magnetic members and conductor lines formed inside the magnetic members respectively. The capacitor layer comprises a dielectric member and first and second internal electrodes which are provided within the dielectric member to be opposite to each other. First and second external electrodes are provided on first and second opposite end surfaces of the laminated structure, while a third external electrode is formed on at least one of first and second opposite side surfaces. First ends of the conductor lines provided in the first and second inductor layers are connected to the first and second external electrodes respectively, while second ends of the conductor lines are electrically connected with each other through the second internal electrode provided in the capacitor layer. The first internal electrode provided in the capacitor layer is electrically connected with the third external electrode. Thus, obtained is an LC composite component which has two inductors interposed in signal lines and a capacitor formed across the junction between the inductors and the ground, to be employed as a noise filter.

12 Claims, 3 Drawing Sheets

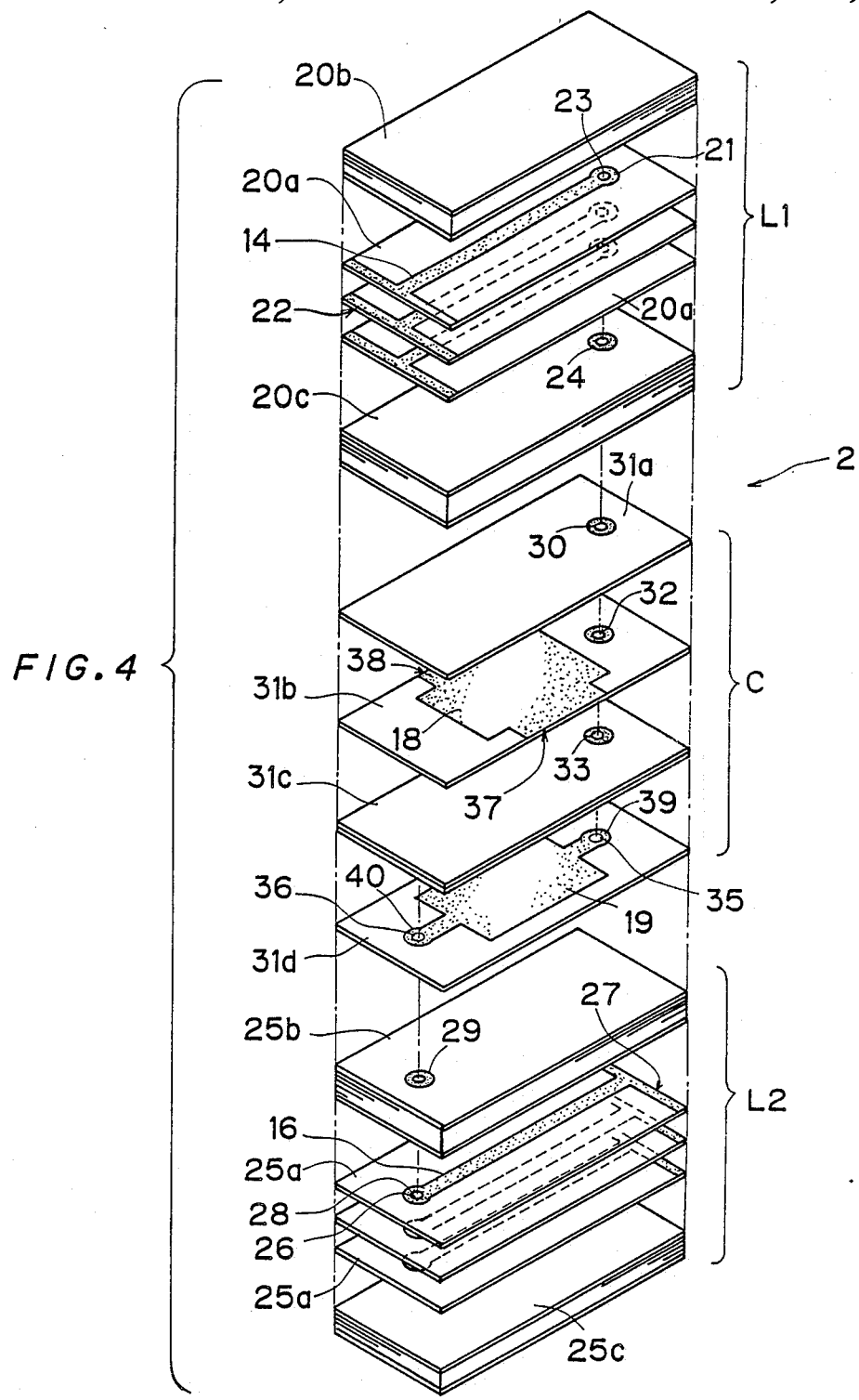

LC COMPOSITE COMPONENT

BACKGROUND OF THE INVENTION

1. Field of the Invention

The present invention relates to an LC composite component, and more particularly, it relates to a chip-type LC composite component which is applicable to a noise filter in a high-frequency circuit.

2. Description of the Background Art

In general, a filter device for filtering high frequency noise signals comprises at least one inductor and at least one capacitor. For example, U.S. Pat. No. 4,320,364 granted to Sakamoto et al. and issued on March 16, 1982 discloses an LC composite component which enables treatment of such an LC filter as one electronic component.

The '364 patent discloses various embodiments. For example, FIG. 16 of the said patent concretely shows the structure of the so-called T-type filter circuit, which is formed as a single electronic component comprising one capacitor C and two inductors L1 and L2, as shown in FIG. 6. In this structure, a pair of opposite capacitor electrodes are provided on both surfaces of a dielectric substrate, to form the capacitor C. A substantially U-shaped input/output lead wire is soldered to one of the capacitor electrodes, while both legs thereof are inserted in ferrite bead members respectively. A ground lead wire is soldered to the other capacitor electrode.

The LC composite component thus formed has three lead wires in consequence. In order to mount the LC composite component on a printed circuit board, for example, the three lead wires are inserted in holes provided in the printed circuit board respectively, to be soldered to conductive patterns provided on the printed circuit board.

However, the LC composite component of the aforementioned structure has such a problem on manufacture that the assembly operation thereof is complicated. Further, it is difficult to reduce the size of the LC composite component since the dielectric substrate employed therein has a relatively wide major surface. In addition, the LC composite component having the aforementioned structure is mounted on the circuit board in an upwardly directed state, and hence a space for mounting the same is increased. Thus, it is difficult to mount the LC composite component on the circuit board in high density.

SUMMARY OF THE INVENTION

Accordingly, an object of the present invention is to provide an LC composite component which can be efficiently manufactured.

Another object of the present invention is to provide an LC composite component which can be miniaturized and chipped to be mounted on a circuit board in high density.

An LC composite component according to the present invention comprises a laminated structure, which is provided with first and second inductor layers and a capacitor layer positioned between the same. This laminated structure has first and second opposite major surfaces, first and second opposite side surfaces and first and second opposite end surfaces. The first inductor layer comprises a first magnetic member and first conductor line means formed inside the first magnetic member. The first conductor line means has a first inner end portion which is positioned inside the first magnetic member and a first outer end portion which is exposed on the first end surface of the laminated structure. The second inductor layer comprises a second magnetic member and second conductor line means formed inside the second magnetic member. The second conductor line means has a second inner end portion which is positioned inside the second magnetic member and a second outer end portion which is exposed on the second end surface of the laminated structure. The capacitor layer comprises a dielectric member and first and second internal electrode means which are opposite to each other through at least a part of the dielectric member. The first internal electrode means has a side end portion which is exposed on at least one of the first and second side surfaces. The second internal electrode means has first and second terminal parts which are positioned inside the dielectric member.

The first inner end portion and the first terminal part are electrically connected with each other in the interior of the laminated structure through first conduction/connection means, which is implemented by through hole connection, for example. The second inner end portion and the second terminal part are electrically connected with each other in the interior of the laminated structure through second conduction/connection means, which is implemented by through hole connection, for example.

A first external electrode is formed on the first end surface of the laminated structure. The first external electrode is electrically connected to the first outer end portion of the first conductor line means. A second external electrode is formed on the second end surface of the laminated structure. The second external electrode is electrically connected to the second outer end portion of the second conductor line means. A third external electrode is formed on at least one of the first and second side surfaces of the laminated structure. The third external electrode is electrically connected to the side end portion of the first internal electrode means.

According to the present invention, the first and second inductors (L1 and L2) are formed in the first and second inductor layers while the capacitor (C) is formed in the capacitor layer so that the inductors and the capacitor are connected with each other by the first and second conduction/connection means, thereby to form the aforementioned T-type filter circuit shown in FIG. 6. In such a filter circuit, the first and second external electrodes define terminals provided on both end portions of the first and second inductors (L1 and L2), which are connected in series with each other, and the third external electrode defines a terminal which is extracted to the exterior of the capacitor (C). In such an LC composite component, the first and second external electrodes are connected to signal lines and the third external electrode is grounded in order to interpose the two inductors in the signal lines and to provide electrostatic capacitance across the junction between the inductors and the ground, thereby to serve as a noise filter.

Thus, according to the present invention, the composite component forming an LC filter circuit can be chipped and miniaturized, so that such a part can be mounted on a printed circuit board with a small space. Further, it is possible to substantially arbitrarily set electrical properties of the first and second inductor layers and the capacitor layer, whereby various LC composite components having different characteristics can be easily manufactured. The characteristics can be changed while maintaining the area of the major surfaces of the laminated structure at a constant value. Thus, various LC composite components having different characteristics can be provided without changing the area required for mounting the same.

According to a preferred embodiment of the present invention, the first and second outer end portions are adapted to define the largest widths in the first and second conductor line means respectively in order to further ensure electrical connection between the first and second outer end portions and the first and second external electrodes. In more concrete terms, the first and second outer end portions are adapted to extend entirely over the first and second end surfaces along the cross direction.

In order to increase electrostatic capacitance provided in the capacitor layer, the first and second internal electrode means may comprise a plurality of first internal electrodes and a plurality of second internal electrodes, which are arranged in an alternate manner, respectively.

The first and second magnetic members and the dielectric member, which are formed of ceramic materials respectively, are preferably cofired to integrate the laminated structure.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is an exploded perspective view showing a laminated structure included in the LC composite component shown in FIG. 1;

DESCRIPTION OF THE PREFERRED EMBODIMENTS

Figure 6:
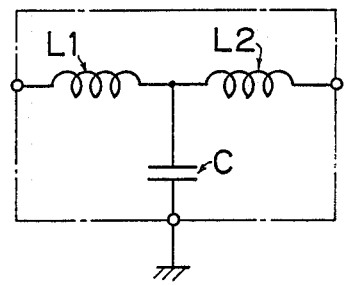
FIG. 6 illustrates a T-type filter circuit.

Referring to FIGS. 1 to 4, an LC composite component 1 is adapted to form the T-type filter circuit which is shown in FIG. 6. The LC composite component 1 comprises a laminated structure 2, which is generally provided with first and second inductor layers L1 and L2 and a capacitor layer C positioned between the same. The laminated structure 2 has first and second opposite major surfaces 3 and 4, first and second opposite side surfaces 5 and 6 and first and second opposite end surfaces 7 and 8.

First and second external electrodes 9 and 10 for signal lines are provided on the first and second end surfaces 7 and 8 of the laminated structure 2 respectively. Further, third external electrodes 11 and 12 for ground connection are provided on the first and second side surfaces 5 and 6 of the laminated structure 2. One of the external electrodes 11 and 12 may be omitted.

The first inductor layer L1 comprises a first magnetic member 13 and a plurality of first conductor lines 14 which are provided inside the magnetic member 13.

The second inductor layer L2 comprises a second magnetic member 15 and a plurality of second conductor lines 16 which are provided inside the magnetic member 15.

The capacitor layer C comprises a dielectric member 17 and first and second internal electrodes 18 and 19 which are opposite to each other through at least a part of the dielectric member 17.

The structure of the LC composite component 1 is now described in further detail with reference to a method of manufacturing the same.

According to this embodiment, the first and second magnetic members 13 and 15 and the dielectric member 17 are formed of ceramic materials respectively.

As shown in FIG. 4, the first inductor layer L1, which is provided in an upper position, comprises a plurality of magnetic green sheets 20a having upper surfaces printed with the first conductor lines 14. A plurality of magnetic green sheets 20b and a plurality of magnetic green sheets 20c, which are printed with no conductor lines, are stacked on and under the magnetic green sheets 20a respectively. Each of the first conductor lines 14 has a first inner end portion 21 which is positioned inside the magnetic member 13 (FIG. 1) and a first outer end portion 22 which is exposed on the first end surface 7 (FIG. 1) of the laminated structure 2. The outer end portion 22 provides the largest width of each conductor line 14, while extending entirely over the first end surface 7 along the cross direction. The respective inner end portions 21 are provided with through hole connecting portions 23, thereby to electrically connect the plurality of first conductor lines 14 in parallel with each other. The lower magnetic green sheets 20c are provided with through hole connecting portions 24 in positions corresponding to the through hole connecting portions 23.

The second inductor layer L2, which is provided in a lower position, is substantially identical to the upper first inductor layer L1, except for difference in direction of arrangement. The second inductor layer L2 comprises a plurality of magnetic green sheets 25a having upper surfaces printed with the second conductor lines 16 respectively. A plurality of magnetic green sheets 25b and a plurality of magnetic green sheets 25c, which are printed with no conductor lines, are stacked on and under the magnetic green sheets 25a respectively. Each of the second conductor lines 16 has a second inner end portion 26 which is positioned inside the second magnetic member 15 (FIG. 1) and a second outer end portion 27 which is exposed on the second end surface 8 (FIG. 1) of the laminated structure 2. Similarly to the first outer end portion 22, the second outer end portion 27 extends entirely over the second end surface 8 along the cross direction. The respective inner end portions 26 are provided with through hole connecting portions 28, to electrically connect the plurality of second conductor lines 16 in parallel with each other. The upper magnetic green sheets 25b are provided with through hole connecting portions 29 in positions corresponding to the through hole connecting portions 28.

The capacitor layer C is obtained by stacking an appropriate number of, for example, one dielectric green sheet 31a, which is provided with a through hole connecting portion 30, a dielectric green sheet 31b which is provided with the aforementioned first internal electrode 18 and a through hole connecting portion 32, an appropriate number of dielectric green sheets 31c which are provided with through hole connecting portions 33, and a dielectric green sheet 31d which is provided with the aforementioned second internal electrode 19 and through hole connecting portions 35 and 36.

The through hole connecting portions 30, 32, 33 and 35 are provided in positions corresponding to the aforementioned through hole connecting portions 23 and 24. The through hole connecting portion 36 is provided in a position corresponding to the aforementioned through hole connecting portions 28 and 29.

Figure 1:
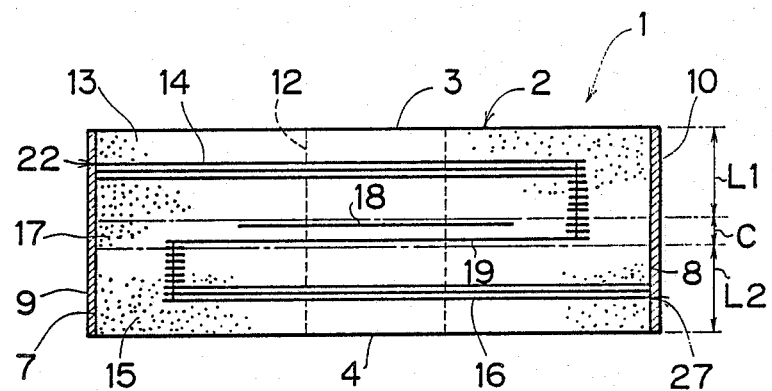
FIG. 1 is a longitudinal sectional view showing an LC composite component according to an embodiment of the present invention.

The first internal electrode 18 has side end portions 37 and 38 which are exposed on the first and second side surfaces 5 and 6 (FIG. 2) of the laminated structure 2 respectively. The second internal electrode 19 has first and second terminal parts 39 and 40 which are positioned inside the dielectric member 17 (FIG. 1). The through hole connecting portions 35 and 36 are provided to be electrically connected with the first and second terminal parts 39 and 40 respectively.

The magnetic green sheets 20a, 20b and 20c included in the first inductor layer L1, the dielectric green sheets 31a, 31b, 31c and 31d included in the capacitor layer C and the magnetic green sheets 25a, 25b and 25c included in the second inductor layer L2 are stacked in the positional relation shown in FIG. 4 and cofired, thereby to obtain the laminated structure 2.

Figure 2:
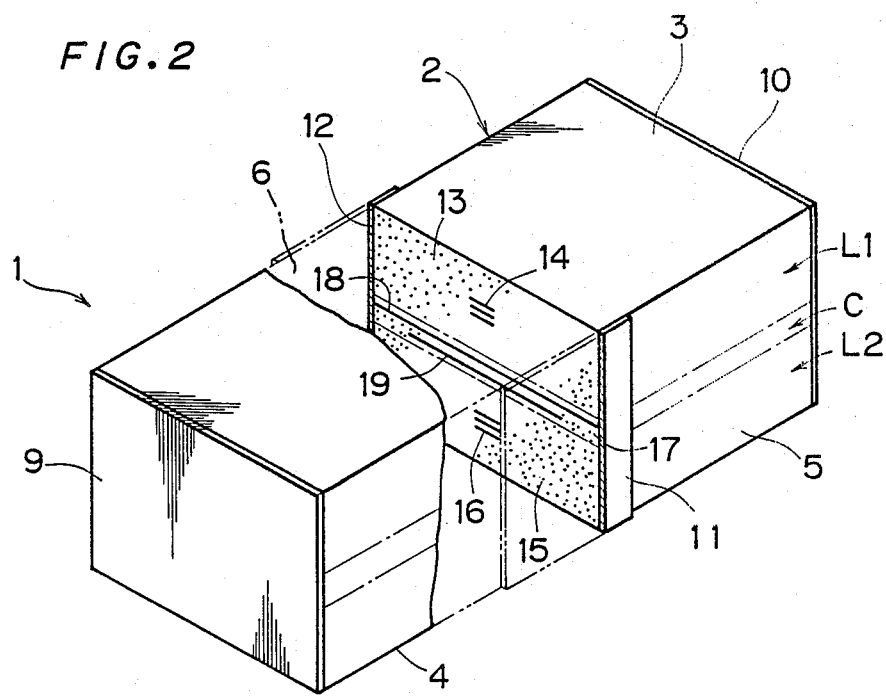
FIG. 2 is a partially fragmented perspective view of the LC composite component shown in FIG. 1.
Figure 3:
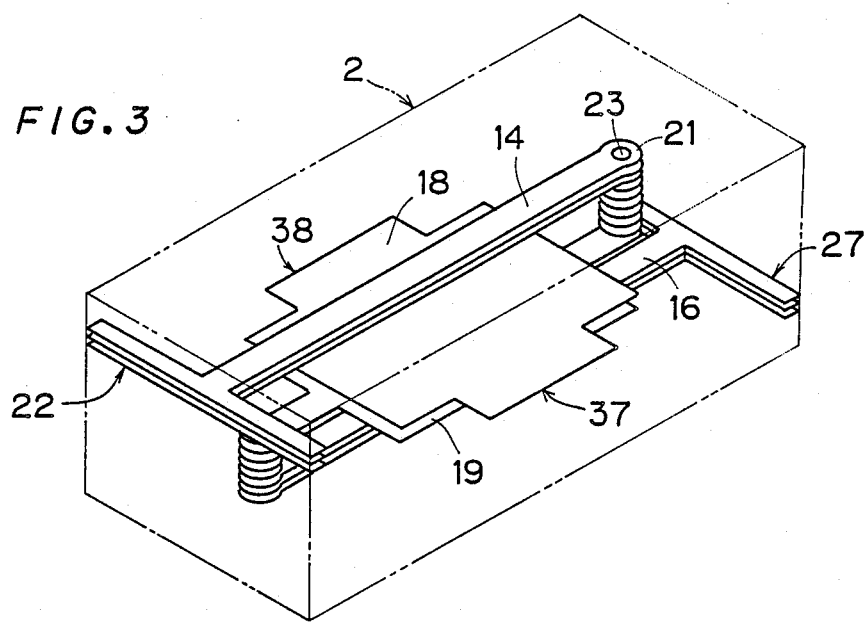
FIG. 3 is a perspective view showing a conductive part formed in the interior of the LC composite component shown in FIG. 1.

The first and second external electrodes 9 and 10 are then provided on the first and second end surfaces 7 and 8 of the laminated structure 2 as shown in FIGS. 1 and 2, while the third external electrodes 11 and 12 are provided on the first and second side surfaces 5 and 6 respectively. Thus, the first outer end portions 22 of the respective conductor lines 14 provided in the first inductor layer L1 are electrically connected with the first external electrode 9, while the second outer end portions 27 of the respective conductor lines 16 provided in the second inductor layer L2 are electrically connected with the second external electrode 10. Further, the side end portions 37 and 38 of the first internal electrode 18 included in the capacitor layer C are electrically connected with the third external electrodes 11 and 12 respectively.

In the interior of the laminated structure 2, the inner end portions 21 of the respective first conductor lines 14 provided in the first inductor layer L1 are electrically connected with the first terminal part 39 of the second internal electrode 19 through the through hole connecting portions 23, 24, 30, 32, 33 and 35. On the other hand, the inner end portions 26 of the respective second conductor lines 16 provided in the second inductor layer L2 are electrically connected with the second terminal part 40 of the second internal electrode 19 through the through hole connecting portions 28, 29 and 36.

The LC composite component 1, the equivalent circuit of which is shown in FIG. 6, is obtained in the aforementioned manner.

When the first and second magnetic members 13 and 15 and the dielectric member 17 are cofired to obtain the laminated structure 2 in an integrated manner as hereinabove described, the first and second magnetic members 13 and 15 are preferably prepared from a magnetic material forming Ni-Zn system ferrite, such as that composed of $0.17NiO + 0.30ZnO + 0.05CuO + 0.48Fe_2O_3$, for example. The dielectric member 17 is preferably prepared from a dielectric material forming Pb system composite perovskite, such as that composed of $0.5Pb(Mg_{\frac{1}{3}}Nb_{\frac{2}{3}})O_3 + 0.5Pb(Mg_{\frac{1}{2}}W_{\frac{1}{2}})O_3$.

Figure 5:
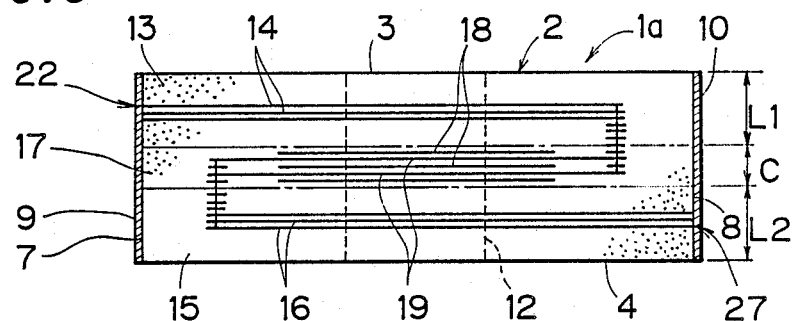
FIG. 5 is a longitudinal sectional view showing an LC composite component according to another embodiment of the present invention.

FIG. 5 is a longitudinal sectional view showing an LC composite component 1a according to another embodiment of the present invention. FIG. 5 corresponds to FIG. 1, and hence corresponding components are indicated by similar reference numerals, to omit redundant description.

The feature of the LC composite component 1a shown in FIG. 5 resides in a capacitor layer C. The capacitor layer C is formed by a plurality of first internal electrodes 18 and a plurality of second internal electrodes 19, which are arranged in an alternate manner. The plurality of first internal electrodes 18 are electrically connected in parallel with each other by a third external electrode 12, for example. On the other hand, the plurality of second internal electrodes 19 are electrically connected in parallel with each other by through hole connection.

According to the LC composite component 1a shown in FIG. 5, large electrostatic capacitance can be obtained in the capacitor layer C.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. An LC composite component comprising:
a laminated structure provided with first and second inductor layers and a capacitor layer positioned therebetween and having first and second opposite major surfaces, first and second opposite side surfaces and first and second opposite end surfaces,
said first inductor layer being provided with a first magnetic member and first conductor line means formed inside said first magnetic member, said first conductor line means having a first inner end portion positioned inside said first magnetic member and a first outer end portion exposed on said first end surface,
said second inductor layer being provided with a second magnetic member and second conductor line means formed inside said second magnetic member, said second conductor line means having a second inner end portion positioned inside said second magnetic member and a second outer end portion exposed on said second end surface,
said capacitor layer being provided with a dielectric member and first and second internal electrode means being opposite to each other through at least a part of said dielectric member, said first internal electrode means having a side end portion exposed on at least one of said first and second side surfaces, said second internal electrode means having first and second terminal parts positioned inside said dielectric member;
first conduction/connection means electrically connecting said first inner end portion with said first terminal part in the interior of said laminated structure;
second conduction/connection means electrically connecting said second inner end portion with said second terminal part in the interior of said laminated structure;

a first external electrode formed on said first end surface to be electrically connected with said first outer end portion;

a second external electrode formed on said second end surface to be electrically connected with said second outer end portion; and a third external electrode provided on at least one of said first and second side surfaces to be electrically connected with said side end portion.

2. An LC composite component in accordance with claim 1, wherein said first and second outer end portions define the largest widths in said first and second conductor line means respectively.

3. An LC composite component in accordance with claim 2, wherein said first and second outer end portions extend entirely over said first and second end surfaces along the cross direction.

4. An LC composite component in accordance with claim 1, wherein said first and second conduction/connection means comprise through hole connection means extending in the interior of said laminated structure respectively.

5. An LC composite component in accordance with claim 1, wherein each of said first and second conductor line means comprises a plurality of conductor lines which are electrically connected in parallel with each other.

6. An LC composite component in accordance with claim 1, wherein said first internal electrode means comprises a plurality of first internal electrodes which are electrically connected in parallel with each other through said third external electrode.

7. An LC composite component in accordance with claim 1, wherein said second internal electrode means comprises a plurality of second internal electrodes and parallel connection means for electrically connecting said plurality of second internal electrodes in parallel with each other.

8. An LC composite component in accordance with claim 7, wherein said parallel connection means comprises through hole connection means which extends in the interior of said capacitor layer.

9. An LC composite component in accordance with claim 6, wherein said second internal electrode means comprises a plurality of second internal electrodes which are electrically connected in parallel with each other, said plurality of first internal electrodes and said plurality of second internal electrodes being arranged in an alternate manner.

10. An LC composite component in accordance with claim 1, wherein said first and second magnetic members and said dielectric member are formed of ceramic materials respectively.

11. An LC composite component in accordance with claim 10, wherein said laminated structure is integrated by cofiring of said first and second magnetic members and said dielectric member.

12. An LC composite component in accordance with claim 11, wherein said first and second magnetic members are formed of Ni-Zn system ferrite and said dielectric member is formed of Pb system composite perovskite.

* * * * *